(12) United States Patent
Heinze et al.

(10) Patent No.: US 8,291,559 B2
(45) Date of Patent: Oct. 23, 2012

(54) PROCESS FOR ADAPTING RESONANCE FREQUENCY OF A BAW RESONATOR

(75) Inventors: Habbo Heinze, Weil im Schoenbuch (DE); Edgar Schmidhammer, Stein an der Traun (DE); Monika Schmiedgen, Olching (DE)

(73) Assignee: Epcos AG, Munich (DE)

( * ) Notice: Subject to any disclaimer, the term of this patent is extended or adjusted under 35 U.S.C. 154(b) by 913 days.

(21) Appl. No.: 12/391,801

(22) Filed: Feb. 24, 2009

(65) Prior Publication Data

US 2010/0212127 A1 Aug. 26, 2010

(51) Int. Cl.
H01L 41/22 (2006.01)
H01L 41/00 (2006.01)
H04R 17/00 (2006.01)
H01R 43/00 (2006.01)
H02N 2/00 (2006.01)

(52) U.S. Cl. .......................... 29/25.35; 29/825; 310/312

(58) Field of Classification Search ................. 29/25.35, 29/825, 830, 846; 310/311, 312, 320, 324, 310/348, 349, 363, 366, 367; 333/133, 186–192
See application file for complete search history.

(56) References Cited

U.S. PATENT DOCUMENTS

| | | | | |
|---|---|---|---|---|
| 2,859,346 A * | 11/1958 | Firestone et al. | ............... | 331/37 |
| 3,222,622 A * | 12/1965 | Curran et al. | ............... | 333/192 |
| 3,293,557 A * | 12/1966 | Denton | ............... | 330/4.6 |
| 3,486,046 A * | 12/1969 | Zalar | ............... | 310/324 |
| 3,549,414 A * | 12/1970 | Curran et al. | ............... | 427/100 |
| 3,686,579 A * | 8/1972 | Everett | ............... | 330/5.5 |
| 3,696,312 A * | 10/1972 | Kuhn et al. | ............... | 333/24 R |
| 3,760,471 A * | 9/1973 | Borner | ............... | 29/25.35 |
| 3,764,928 A * | 10/1973 | Gires et al. | ............... | 330/5.5 |
| 3,916,490 A * | 11/1975 | Sheahan et al. | ............... | 29/25.35 |
| 3,924,312 A * | 12/1975 | Coussot et al. | ............... | 29/25.35 |
| 4,019,181 A * | 4/1977 | Olsson et al. | ............... | 342/42 |
| 4,320,365 A * | 3/1982 | Black et al. | ............... | 333/187 |
| 4,365,216 A * | 12/1982 | Minagawa et al. | ............... | 333/153 |
| 4,418,299 A * | 11/1983 | Momosaki | ............... | 310/361 |
| 4,456,850 A * | 6/1984 | Inoue et al. | ............... | 310/324 |
| 4,502,932 A * | 3/1985 | Kline et al. | ............... | 204/192.18 |
| 4,556,812 A * | 12/1985 | Kline et al. | ............... | 310/324 |
| 4,562,370 A * | 12/1985 | Von Dach | ............... | 310/312 |
| 4,642,508 A * | 2/1987 | Suzuki et al. | ............... | 310/321 |
| 4,897,618 A * | 1/1990 | Svetanoff | ............... | 331/76 |
| 5,153,476 A * | 10/1992 | Kosinski | ............... | 310/313 R |
| 5,162,691 A * | 11/1992 | Mariani et al. | ............... | 310/321 |
| 5,166,646 A * | 11/1992 | Avanic et al. | ............... | 331/107 A |
| 5,185,589 A * | 2/1993 | Krishnaswamy et al. | ..... | 333/133 |
| 5,233,259 A * | 8/1993 | Krishnaswamy et al. | ..... | 310/324 |
| 5,332,943 A * | 7/1994 | Bhardwaj | ............... | 310/326 |
| 5,382,930 A * | 1/1995 | Stokes et al. | ............... | 333/191 |
| 5,446,306 A * | 8/1995 | Stokes et al. | ............... | 257/416 |
| 5,587,620 A * | 12/1996 | Ruby et al. | ............... | 310/346 |
| 5,596,239 A * | 1/1997 | Dydyk | ............... | 310/311 |

(Continued)

*Primary Examiner* — David Angwin
(74) *Attorney, Agent, or Firm* — Slater & Matsil, L.L.P.

(57) ABSTRACT

A method of manufacturing a filter circuit including series and parallel coupled BAW resonators is given which compensates for frequency tolerances of the resonators which are due to the manufacturing process. The new method includes measuring a resonance frequency of at least one type of the BAW resonators produced on a wafer and defining a deviation from a desired frequency. A trimming layer is then deposited onto the entire wafer. At last, a thickness portion of the trimming layer is selectively removed, the portion being dependent on a location on the wafer and on the calculated deviation of the resonance frequency at this location.

14 Claims, 3 Drawing Sheets

U.S. PATENT DOCUMENTS

| | | | | |
|---|---|---|---|---|
| 5,629,906 | A * | 5/1997 | Sudol et al. | 367/162 |
| 5,692,279 | A * | 12/1997 | Mang et al. | 29/25.35 |
| 5,714,917 | A * | 2/1998 | Ella | 332/144 |
| 5,801,603 | A * | 9/1998 | Yamamoto et al. | 333/189 |
| 5,844,452 | A * | 12/1998 | Yamamoto et al. | 333/189 |
| 5,872,493 | A * | 2/1999 | Ella | 333/191 |
| 5,873,153 | A * | 2/1999 | Ruby et al. | 29/25.35 |
| 5,873,154 | A * | 2/1999 | Ylilammi et al. | 29/25.35 |
| 5,894,647 | A * | 4/1999 | Lakin | 29/25.35 |
| 5,910,756 | A * | 6/1999 | Ella | 333/133 |
| 6,051,907 | A * | 4/2000 | Ylilammi | 310/312 |
| 6,060,818 | A * | 5/2000 | Ruby et al. | 310/363 |
| 6,081,171 | A * | 6/2000 | Ella | 333/189 |
| 6,107,721 | A * | 8/2000 | Lakin | 310/321 |
| 6,262,637 | B1 * | 7/2001 | Bradley et al. | 333/133 |
| 6,307,447 | B1 * | 10/2001 | Barber et al. | 333/189 |
| 6,339,276 | B1 * | 1/2002 | Barber et al. | 310/312 |
| 6,407,649 | B1 * | 6/2002 | Tikka et al. | 333/133 |
| 6,414,569 | B1 * | 7/2002 | Nakafuku | 333/188 |
| 6,437,667 | B1 * | 8/2002 | Barber et al. | 333/188 |
| 6,469,597 | B2 * | 10/2002 | Ruby et al. | 333/187 |
| 6,480,074 | B1 * | 11/2002 | Kaitila et al. | 333/188 |
| 6,483,229 | B2 * | 11/2002 | Larson et al. | 310/348 |
| 6,486,751 | B1 * | 11/2002 | Barber et al. | 333/187 |
| 6,518,860 | B2 * | 2/2003 | Ella et al. | 333/189 |
| 6,524,971 | B1 * | 2/2003 | Fetter et al. | 438/778 |
| 6,570,468 | B2 * | 5/2003 | Ma et al. | 333/188 |
| 6,603,241 | B1 * | 8/2003 | Wong et al. | 310/335 |
| 6,650,204 | B2 * | 11/2003 | Ma et al. | 333/188 |
| 6,657,517 | B2 * | 12/2003 | Barber et al. | 333/187 |
| 6,668,618 | B2 * | 12/2003 | Larson et al. | 73/24.01 |
| 6,674,291 | B1 * | 1/2004 | Barber et al. | 324/520 |
| 6,675,450 | B1 * | 1/2004 | Fetter et al. | 29/25.35 |
| 6,710,508 | B2 * | 3/2004 | Ruby et al. | 310/312 |
| 6,732,415 | B2 * | 5/2004 | Nakatani et al. | 29/25.35 |
| 6,743,731 | B1 * | 6/2004 | Huggins | 438/706 |
| 6,746,577 | B1 * | 6/2004 | Barber et al. | 204/192.13 |
| 6,774,746 | B2 * | 8/2004 | Whatmore et al. | 333/189 |
| 6,842,089 | B2 * | 1/2005 | Lee | 333/189 |
| 6,861,783 | B2 * | 3/2005 | Wang et al. | 310/324 |
| 6,867,667 | B2 * | 3/2005 | Takeuchi et al. | 333/189 |
| 6,874,211 | B2 * | 4/2005 | Bradley et al. | 29/25.35 |
| 6,885,260 | B2 * | 4/2005 | Nishimura et al. | 333/133 |
| 6,903,496 | B2 * | 6/2005 | Takeuchi et al. | 310/363 |
| 6,917,139 | B2 * | 7/2005 | Sunwoo et al. | 310/321 |
| 6,927,649 | B2 * | 8/2005 | Metzger et al. | 333/133 |
| 6,930,437 | B2 * | 8/2005 | Nakatani et al. | 310/324 |
| 6,946,320 | B2 * | 9/2005 | Sunwoo et al. | 438/106 |
| 6,949,268 | B2 * | 9/2005 | Wang et al. | 427/58 |
| 6,954,121 | B2 * | 10/2005 | Bradley et al. | 333/187 |
| 6,965,281 | B2 * | 11/2005 | Sunwoo et al. | 333/133 |
| 6,989,723 | B2 * | 1/2006 | Komuro et al. | 333/133 |
| 6,992,420 | B2 * | 1/2006 | Jang et al. | 310/324 |
| 6,998,940 | B2 * | 2/2006 | Metzger | 333/187 |
| 7,019,604 | B2 * | 3/2006 | Gotoh et al. | 333/187 |
| 7,030,718 | B1 * | 4/2006 | Scherer | 333/188 |
| 7,031,689 | B2 * | 4/2006 | Frank | 455/333 |
| 7,057,477 | B2 * | 6/2006 | Wang | 333/189 |
| 7,058,265 | B2 * | 6/2006 | Amparan et al. | 385/40 |
| 7,078,984 | B2 * | 7/2006 | Komuro et al. | 333/133 |
| 7,101,721 | B2 * | 9/2006 | Jorgenson et al. | 438/14 |
| 7,114,252 | B2 * | 10/2006 | Tanielian et al. | 29/852 |
| 7,116,034 | B2 * | 10/2006 | Wang et al. | 310/324 |
| 7,123,883 | B2 * | 10/2006 | Mages | 455/78 |
| 7,128,941 | B2 * | 10/2006 | Lee | 427/58 |
| 7,170,215 | B2 * | 1/2007 | Namba et al. | 310/324 |
| 7,180,224 | B2 * | 2/2007 | Bouche et al. | 310/320 |
| 7,187,254 | B2 * | 3/2007 | Su et al. | 333/189 |
| 7,199,504 | B2 * | 4/2007 | Komuro et al. | 310/320 |
| 7,224,245 | B2 * | 5/2007 | Song et al. | 333/133 |
| 7,227,292 | B2 * | 6/2007 | Rich et al. | 310/312 |
| 7,230,509 | B2 * | 6/2007 | Stoemmer | 333/133 |
| 7,233,218 | B2 * | 6/2007 | Park et al. | 333/133 |
| 7,236,066 | B2 * | 6/2007 | Ebuchi | 333/187 |
| 7,242,270 | B2 * | 7/2007 | Larson et al. | 333/187 |
| 7,250,831 | B2 * | 7/2007 | Song et al. | 333/133 |
| 7,271,684 | B2 * | 9/2007 | Nishihara et al. | 333/133 |
| 7,275,292 | B2 * | 10/2007 | Ruby et al. | 29/25.35 |
| 7,281,304 | B2 * | 10/2007 | Kim et al. | 29/25.35 |
| 7,282,388 | B2 * | 10/2007 | Kwon | 438/106 |
| 7,296,329 | B1 * | 11/2007 | Barber et al. | 29/25.35 |
| 7,304,551 | B2 * | 12/2007 | Kawamura | 333/133 |
| 7,310,861 | B2 * | 12/2007 | Aigner et al. | 29/25.35 |
| 7,328,497 | B2 * | 2/2008 | Barber et al. | 29/594 |
| 7,332,061 | B2 * | 2/2008 | Wang et al. | 204/192.18 |
| 7,332,985 | B2 * | 2/2008 | Larson et al. | 333/187 |
| 7,358,831 | B2 * | 4/2008 | Larson et al. | 333/187 |
| 7,362,198 | B2 * | 4/2008 | Larson et al. | 333/187 |
| 7,367,095 | B2 * | 5/2008 | Larson et al. | 29/25.35 |
| 7,369,013 | B2 * | 5/2008 | Fazzio et al. | 333/187 |
| 7,370,396 | B2 * | 5/2008 | Namba et al. | 29/25.35 |
| 7,380,320 | B2 * | 6/2008 | Nakatani | 29/25.35 |
| 7,388,454 | B2 * | 6/2008 | Ruby et al. | 333/187 |
| 7,388,455 | B2 * | 6/2008 | Larson et al. | 333/189 |
| 7,391,285 | B2 * | 6/2008 | Larson et al. | 333/189 |
| 7,391,286 | B2 * | 6/2008 | Jamneala et al. | 333/189 |
| 7,400,217 | B2 * | 7/2008 | Larson et al. | 333/187 |
| 7,408,287 | B2 * | 8/2008 | Matsumoto et al. | 310/320 |
| 7,408,428 | B2 * | 8/2008 | Larson, III | 333/187 |
| 7,423,503 | B2 * | 9/2008 | Larson et al. | 333/189 |
| 7,424,772 | B2 * | 9/2008 | Larson, III | 29/25.35 |
| 7,425,787 | B2 * | 9/2008 | Larson, III | 310/311 |
| 7,427,819 | B2 * | 9/2008 | Hoen et al. | 310/320 |
| 7,435,613 | B2 * | 10/2008 | Barber et al. | 438/53 |
| 7,436,269 | B2 * | 10/2008 | Wang et al. | 333/133 |
| 7,439,824 | B2 * | 10/2008 | Aigner et al. | 333/187 |
| 7,443,269 | B2 * | 10/2008 | Chow et al. | 333/187 |
| 7,446,450 | B2 * | 11/2008 | Boland et al. | 310/309 |
| 7,455,786 | B2 * | 11/2008 | Aigner et al. | 216/13 |
| 7,463,499 | B2 * | 12/2008 | Larson, III | 363/69 |
| 7,479,685 | B2 * | 1/2009 | Fazzio et al. | 257/416 |
| 7,508,286 | B2 * | 3/2009 | Ruby et al. | 333/189 |
| 7,514,844 | B2 * | 4/2009 | Unkrich | 310/317 |
| 7,522,018 | B2 * | 4/2009 | Milsom et al. | 333/187 |
| 7,525,398 | B2 * | 4/2009 | Nishimura et al. | 333/189 |
| 7,554,426 | B2 * | 6/2009 | Lee et al. | 333/187 |
| 7,561,009 | B2 * | 7/2009 | Larson et al. | 333/187 |
| 7,579,926 | B2 * | 8/2009 | Jhung | 333/133 |
| 7,586,392 | B2 * | 9/2009 | Unkrich | 333/189 |
| 7,600,303 | B1 * | 10/2009 | Hamou et al. | 29/25.35 |
| 7,612,488 | B1 * | 11/2009 | Bouche et al. | 310/364 |
| 7,612,636 | B2 * | 11/2009 | Jamneala et al. | 333/189 |
| 7,615,833 | B2 * | 11/2009 | Larson et al. | 257/416 |
| 7,629,865 | B2 * | 12/2009 | Ruby | 333/189 |
| 7,631,412 | B2 * | 12/2009 | Barber et al. | 29/594 |
| 7,649,304 | B2 * | 1/2010 | Umeda et al. | 310/320 |
| 7,675,390 | B2 * | 3/2010 | Larson, III | 333/189 |
| 7,714,684 | B2 * | 5/2010 | Ruby et al. | 333/187 |
| 7,732,977 | B2 * | 6/2010 | Martin et al. | 310/317 |
| 7,737,807 | B2 * | 6/2010 | Larson et al. | 333/189 |
| 7,746,677 | B2 * | 6/2010 | Unkrich | 363/125 |
| 7,791,434 | B2 * | 9/2010 | Fazzio et al. | 333/187 |
| 7,791,435 | B2 * | 9/2010 | Jamneala | 333/189 |
| 7,793,395 | B2 * | 9/2010 | Ha et al. | 29/25.35 |
| 7,802,349 | B2 * | 9/2010 | Ruby et al. | 29/25.35 |
| 7,852,644 | B2 * | 12/2010 | Larson, III | 363/69 |
| 7,855,618 | B2 * | 12/2010 | Frank et al. | 333/187 |
| 7,868,522 | B2 * | 1/2011 | Ruby | 310/346 |
| 7,895,720 | B2 * | 3/2011 | Barber et al. | 29/25.35 |
| 7,924,120 | B2 * | 4/2011 | Umeda | 333/187 |
| 7,996,984 | B2 * | 8/2011 | Jhung | 29/594 |
| 8,080,854 | B2 * | 12/2011 | Fazzio et al. | 257/416 |
| 8,143,082 | B2 * | 3/2012 | Dungan et al. | 438/50 |
| 8,186,030 | B2 * | 5/2012 | Nakatani | 29/25.35 |
| 8,188,810 | B2 * | 5/2012 | Fazzio et al. | 333/187 |
| 2001/0054941 | A1 * | 12/2001 | Shibata et al. | 333/189 |

* cited by examiner

PROCESS FOR ADAPTING RESONANCE FREQUENCY OF A BAW RESONATOR

TECHNICAL FIELD

The invention relates to a BAW resonator device (BAW=bulk acoustic wave), for example a BAW Filter used for RF filters in mobile communication and other wireless applications.

BACKGROUND

BAW resonators and filter circuits comprising BAW resonators are manufactured by subsequently depositing and structuring functional layers of the resonator on top of a substrate. Such layers comprise at least a bottom electrode layer, a piezoelectric layer, and a top electrode layer. Techniques well known from the semiconductor micro electronic devices can be used for manufacturing these layers.

BAW resonators are characterized by a resonance frequency that are dependent on the total thickness of the functional layers of the resonator and, if present, a thickness of one or more additional layers such as passivation layers or tuning layers on top of the BAW resonator.

Like many other processes, a layer deposition on a substrate, typically a wafer, produces thickness deviations over the entire substrate, over a batch of a multitude of parallel processed substrates or from batch to batch. These deviations and tolerances may shift a resonator's resonance frequency to an extent that the specification of a given standard fails. With a process according to the state of the art, deviations up to +/−15 MHz are observed at devices resonating in the 2 GHz domain. Thus, methods are required to re-shift the resonance back into the specification for as many devices as possible to enhance the yield and reduce production costs.

Duplexers required for separating Tx and Rx signals in mobile phones working in a WCDMA standard are the most common application of filter circuits comprising BAW resonators. Most of these standards have specifications with very small tolerances for the frequency of the center frequency of such filters. More serious are the specifications for the skirts of the filter passbands of Tx and Rx filters that face each other. In the PCS standard the distance between the respective passband band edges (edges are located at 1910 MHz and 1930 MHz) of the neighboring bands are only 20 MHz. With a flank steepness easy to achieve according to state of the art resonators and manufacturing processes there is only left a tolerance of 2-3 MHz that the center frequency may deviate from without leaving the specification of the standard.

It is known to deposit a trimming layer of a calculated thickness all over the entire wafer and all BAW resonators manufactured on this wafer to shift as many resonators as possible into a desired frequency range keeping the specification. But it is impossible to optimize all BAW resonators if variations of center frequency are too big over the same wafer or over the same batch of wafers.

SUMMARY

In one aspect, the invention provides a method of manufacturing a filter circuit comprising BAW resonators. Use of the method enhances the yield, keeping BAW resonators and filter circuits within the specification.

In one embodiment, it is proposed to deposit a trimming layer onto the substrate with the manufactured tuned BAW resonators and then to selectively remove a thickness portion of the trimming layer, the portion being dependent on a location on the wafer and on the deviation of a center frequency of a BAW resonator at this location.

As an example, a method can be used to manufacture a filter circuit comprising series and parallel coupled BAW resonators. Functional layers are subsequently deposited onto a substrate wafer for all BAW resonators in parallel. The active layers comprise at least a bottom electrode, a piezoelectric, and a top electrode. Each functional layer may be structured immediately after deposition to receive not a single BAW resonator but a multitude of circuits of BAW resonators, each circuit comprising a series of BAW resonators electrically coupled in series as well as parallel BAW resonators electrically coupled in parallel within each circuit. Coupling is done by structuring the electrode layers accordingly to form top and bottom electrodes as well as circuiting portions to make the desired coupling of series and parallel BAW resonators.

After completing the deposition and structuring of the functional layers a tuning layer of a selected thickness of a first dielectric is deposited selectively onto the parallel BAW resonators on the wafer. This is done to shift the resonance frequency of these resonators by the additional mass of the tuning layer to a lower frequency according to the known design principle of the filter circuit being a ladder type or a lattice type circuit realizing a pass band filter.

Then, a resonance frequency of at least one type of the BAW resonators on the wafer is measured and a deviation of the measured resonance frequencies from a desired value is calculated. The deviation is planned to be a too high resonance frequency needing a further mass impact on top of the BAW resonators to shift the resonance frequency into the desired range.

Shifting is done by depositing the trimming layer onto the entire wafer and selectively removing a thickness portion of the trimming layer. The portion is dependent on a location on the wafer and on the frequency deviation at this location and is inversely dependent on a thickness of an additional trimming layer calculated from the deviation.

With this trimming layer and a selected removing method it is possible to shift the resonance frequency of most of the BAW resonators into a range that obeys the standard. This notably enhances the yield of filter circuits falling within the standard. A total yield of about 90% or more is realistic with this method. Not counting defective resonators, the amount of BAW resonators having the desired frequency can reach up to 100 per cent by this method.

In an embodiment of the invention, the step of depositing a trimming layer onto the entire wafer comprises first a deposition of a mask layer covering the BAW resonators of a first type and uncovering the BAW resonators of the second type. This first type is usually the series type that does not need a frequency shift to a lower resonance frequency. By this mask layer the deposition of material of the trimming layer on the areas covered by the mask is avoided. In a further step the mask is removed together with the portion of the trimming layer deposited thereon. The mask layer can be a resist layer of a resin. A photoresist that can be structured directly is preferred.

The step of measuring a resonance frequency of at least one type of the BAW resonators may comprise measuring of the resonance frequencies of both types of the BAW resonators. Moreover, the resonance frequency may be measured by measuring the frequency properties of the filter circuits. This allows the calculation of the frequency deviation for all resonators and to shift both types of resonators into the desired or necessary range.

Further it is advantageous to measure the resonance frequency of BAW resonators manufactured on a multitude of wafers that are processed at the same time. These wafers belonging to the same batch can then be tuned and trimmed in parallel with the new method.

In the step of measuring a resonance frequency of at least one type of the BAW resonators, only selected filter circuits that are distributed over the wafer are measured. The distribution of the selected filters may be a regular one. But it is also possible to select filter circuits at those locations that are prone to a strong thickness variation of any of the functional layer due to a property of the used deposition apparatus. A representative selection of measured filter circuits may comprise about 400 circuits of 20,000.

Using the measured values of selected filter circuits the deviation of the resonance frequencies from a desired value may be calculated for the other filter circuits by an interpolation step. This step would result in a distribution of the deviation over the whole wafer so that a deviation is calculated for each filter circuit or each BAW resonator on the wafer or on the wafers of the batch.

The trimming layer may comprise a layer of an oxide or a nitride, preferably of silicon. These materials are easily deposited by known controllable processes and apparatuses. Moreover these materials are relatively low weighted and thus have a relative low impact on the resonance frequency of the BAW resonators on which they are deposited. Hence, an unavoidable thickness tolerance during deposition or further processing results in a too high frequency shift of the respective BAW resonator.

The material of the tuning layer and trimming may be the same or different. Both layers are applied to shift resonance frequency. Hence, properties supporting one of these processes are advantageous for both.

It is known that a desired resonance frequency of the BAW resonator defines the necessary total thickness of the BAW resonator. It is preferred to deposit the functional layers in a total thickness substantially less than the thickness necessary to result in the desired resonance frequency. Then, after removing the thickness portion of the trimming layer, another thickness portion of the trimming layer remains on top of the BAW resonators. This remaining thickness portion may function as a passivation layer of the filter circuit. It contributes to the total thickness of the resulting BAW resonator and hence contributes to the frequency of the BAW resonator. This passivation function of the remaining trimming layer portion applies for the oxide or nitride layers.

It is preferred to deposit the trimming layer in a thickness $d0$ where $d0 \geqq 2dR$ and $dR$ is the remaining thickness portion of the trimming layer calculated for resulting in the desired frequency of the filter circuit or the BAW resonator. This means, in other words, that the thickness portion of the trimming layer that has to be removed accords to or extends the remaining thickness portion. At this thickness relation the process of removing the thickness portion can be controlled easily.

The process is controlled in that a desired thickness of the BAW resonators at the end of the manufacturing process is calculated to be the sum of the total thickness of the functional layers plus at least 10 nm of the remaining trimming layer. A thickness of about 30 nm is preferred. In an embodiment, the trimming layer is deposited to a thickness of about 90 nm and preferably 100 nm or more for BAW resonators that resonate about 2 GHz. For lower frequencies a smaller thickness of the trimming layer may be selected.

A laser ablation process can be used to remove the necessary thickness portion of the trimming layer. The amount of energy that is brought into the trimming layer at a given location on the wafer by the laser is dependent on the time of exposition to the scanning laser. The amount of energy impacting on the trimming layer at this location controls the thickness portion removed by the laser. This process can be controlled easily without masking by a respective scanning program. But any other processes for controllably removing a thickness portion of the trimming layer may be used as well.

Another preferred process is ablation by an ion beam. For this process inert ions like noble gas ions may be used as well as reactive ions like halogenides which are able to make a chemical reaction with the trimming layer material. This process has another advantage since the energy of the ion beam can be controlled by an accelerating voltage.

But any other processes for controllably removing a thickness portion of the trimming layer may be used as well.

The process can be controlled in the thickness of deposition and ablation that a tolerance of most 4 nm results in total for both processes, i.e., for deposition and ablation of the trimming layer. In some cases a tolerance of +/−1 nm may be reached. This complies with a frequency tolerance of ±0.5 MHz at a center frequency of about 1.9 GHz.

The method can be used for the manufacture of duplexers comprising two filters, at least one of them being a filter circuit of BAW resonators. As the correct frequency position is most relevant for the two facing filter skirts of the duplexer's pass bands it is possible to use the proposed trimming process only for one type of BAW resonator. A filter circuit of BAW resonators used for the Tx filter of a duplexer needs only trimming of the series resonators to have most effect onto the upper skirt while for a Rx filter a trimming of the parallel resonators has improved the impact on the frequency exactness of the lower skirt.

For conducting a trimming process selectively for one type of BAW resonators the other type of resonators can be protected by a resist mask deposited or structured to selectively cover those resonators that are not to be trimmed.

BRIEF DESCRIPTION OF THE DRAWINGS

Embodiments of the invention will be explained further in detail with respect to the accompanied drawings. The figures are schematic only and not drawn to scale. Some parts may be depicted enlarged such that no relative dimensions can be taken from the figures.

FIG. 1, show subsequent states in manufacturing a filter circuit comprising BAW resonators;

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

FIG. 1 shows schematic cross sections of a filter circuit comprising BAW resonators at different stages of manufacture. Subsequent functional layers of the filter circuit are deposited and optionally structured after deposition. A substrate SU may comprise a wafer of a crystalline material such as silicon, for example. On top of the substrate SU may be arranged an acoustic mirror comprising, for example, two pairs of approximately lambda quarter ($\lambda/4$) thick layers (not depicted in the figure). Each pair comprises two layers with differing acoustic impedance, i.e., a layer of high impedance and a layer of low impedance. For the first layer a heavy metal W or Mo may be used while an oxide is a preferred material for the low impedance mirror layers.

Another resonator concept uses a substrate that is thinned to a membrane under the resonator thereby allowing the acoustic energy to be kept within the functional layers of the resonator. This concept does not need a mirror.

The first layer of the functional layers is the bottom electrode BE. A heavy metal like W or Mo is preferred, but other conductive materials such as Al are possible for this layer as well. The bottom electrode BE layer is structured to extend mainly in the resonator area under the respective resonator. Adjacent resonator areas are formed by this structuring. Further it is possible to electrically couple two adjacent resonators by forming a conductive connection from the bottom electrode layer material.

The next layer is the piezoelectric layer PL. It is deposited on top of the bottom electrode and may comprise AlN, ZnS or another piezoelectric material that can be deposited as a thin film. Structuring of the piezoelectric layer PS follows to separate the layer into single resonators and/or to get access to the bottom electrode.

Figure 1A:
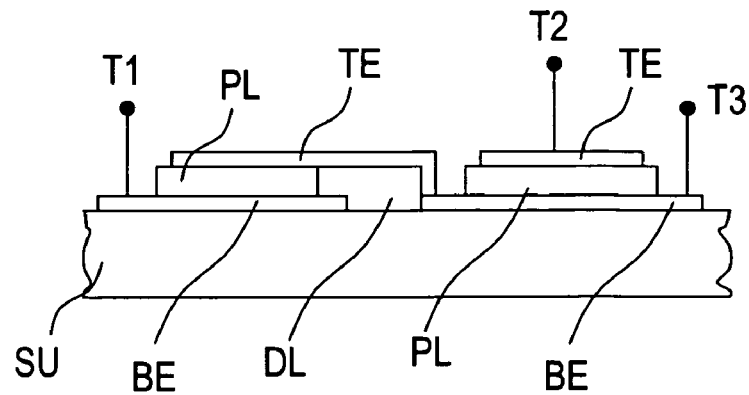
FIGS. 1A to 1D, collectively

A top electrode TE, which may comprise Al, is deposited on top of the piezoelectric layer. A heavy metal may be preferred alternatively. Structuring of this layer is done to simultaneously form electric connections out of the top electrode layer to couple the resonators in the necessary way. Three electric terminals allow the driving of the two depicted resonators as a series or a parallel resonator each. FIG. 1A shows the arrangement after this step.

Figure 1B:
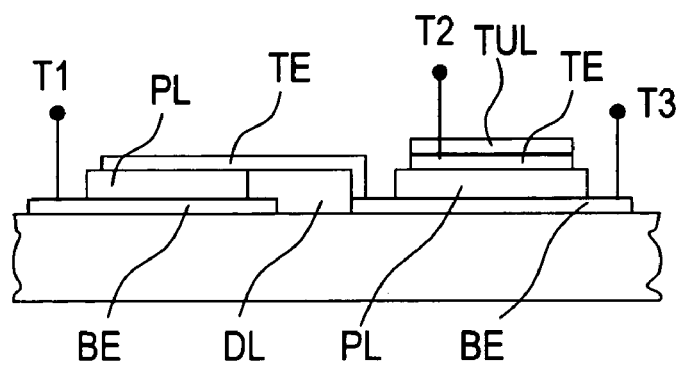

In a subsequent next step, a tuning layer TUL is deposited and structured. It is possible to first arrange a resist mask on top of the resonators and then deposit the tuning layer material. A nitride or oxide of silicon is preferred for the tuning layer TUL. After structuring, the tuning layer TUL is only on top of those resonators with a frequency that is to be shifted to a lower frequency. Thus, the thickness of the tuning layer TUL accords to the difference of resonance frequency necessary between series and parallel resonators. FIG. 1B shows the arrangement at this point, the right resonator carrying the tuning layer has a lower resonance frequency.

According to an embodiment of the invention, the total thickness of the functional layers of the resonators is controlled to be smaller than necessary. Hence, the so produced resonators have a resonance frequency above the value desired for the filter circuit.

In a subsequent step, a selected number of resonators are tested to determine their resonance frequencies. Alternatively, it is possible to measure the frequency response of a whole filter circuit and not of a single resonator of the circuit with a detector head. The measuring results of the selected resonators are then used to determine by interpolation the distribution of frequencies over the substrate which may be a wafer. The deviation of the measured frequencies from the respective desired frequency in the filter circuit is calculated along with the trimming layer thickness distribution necessary to shift the resonators' frequency to the desired frequency by means of a trimming layer having an according thickness.

Figure 1C:
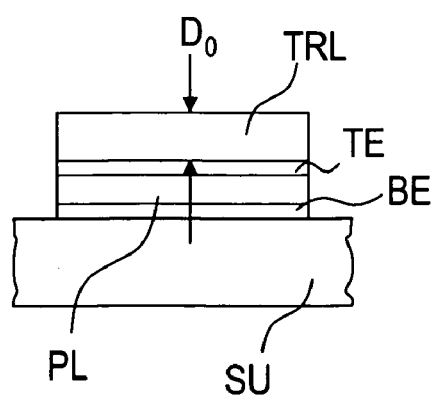

In a subsequent step, a trimming layer TRL is deposited onto the entire wafer in a thickness $D_0$ greater than the necessary tuning layer thickness calculated $D_R$. FIG. 1C shows a single resonator carrying a portion of the trimming layer TRL.

Figure 1D:
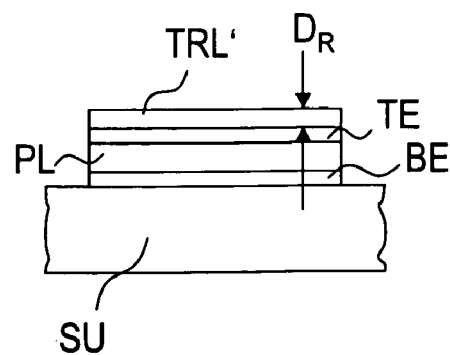

In a subsequent step, a thickness portion the trimming layer TRL is removed in a controlled ablating process. The removed thickness portion at a given location on the wafer accords to the difference between deposited thickness $D_0$ and the at least remaining thickness $D_R$. As the thickness portion to be removed varies according to the distribution of measured frequencies over the wafer the ablating process is controlled accordingly. An ion beam etch or a laser ablation are possible ablating processes. FIG. 1D shows the resonator with the thinned trimming layer TRL' of desired thickness $D_R$. As a result, the resonator now has the desired resonance frequency at only a small tolerance of at most about 0.5 MHz.

Figure 2:
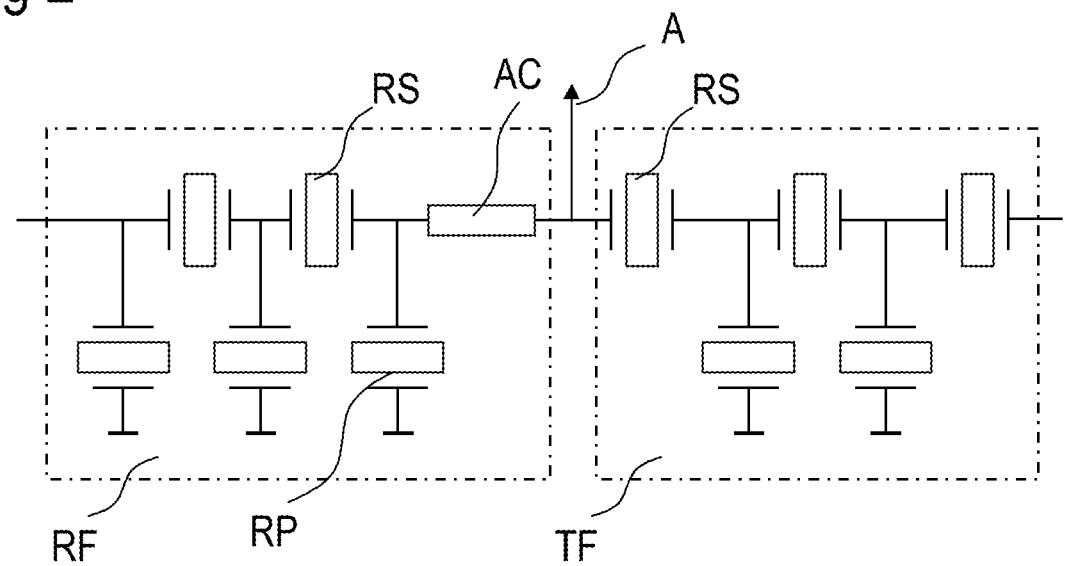
FIG. 2 shows a block diagram of a duplexer with two filter circuits comprising BAW resonators.

FIG. 2 shows a block diagram of a duplexer comprising a receive filter RF and a transmission filter TF, each being connected to an antenna. Each filter RF,TF is formed by a filter circuit comprising series BAW resonators RS coupled in series between the antenna and an output terminal, and parallel resonators RP coupled in parallel to the series connection in a shunting line to ground. An adaptive circuit AC between receive filter RF and the antenna provides a phase shift, for example, to shift the receive filter to "open" in the pass band of the transmission filter and vice versa.

Figure 3:
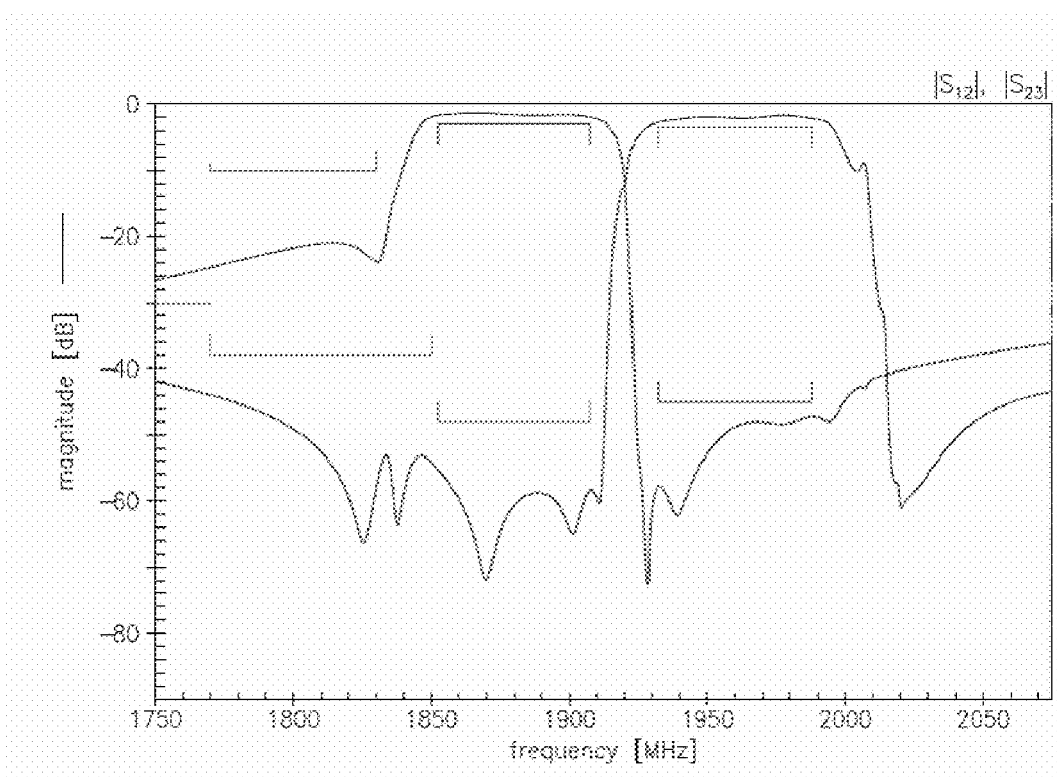
FIG. 3 shows in a diagram two transmission curves of the filters of a duplexer comprising BAW resonators.

FIG. 3 shows the transmission curves of a duplexer made according to the inventive process above. The duplexer is adapted for the PCS standard and has a very small spacing between the two facing edges of the transmission band TB and the receive band RB of the two filters. It can be seen easily that a sufficient attenuation in the neighbor band can be reached only when the frequency tolerance is as small as possible,. An embodiment of the invention provides a method to reach this goal for most of the filter circuits by the subsequent trimming step as explained.

Figure 4:
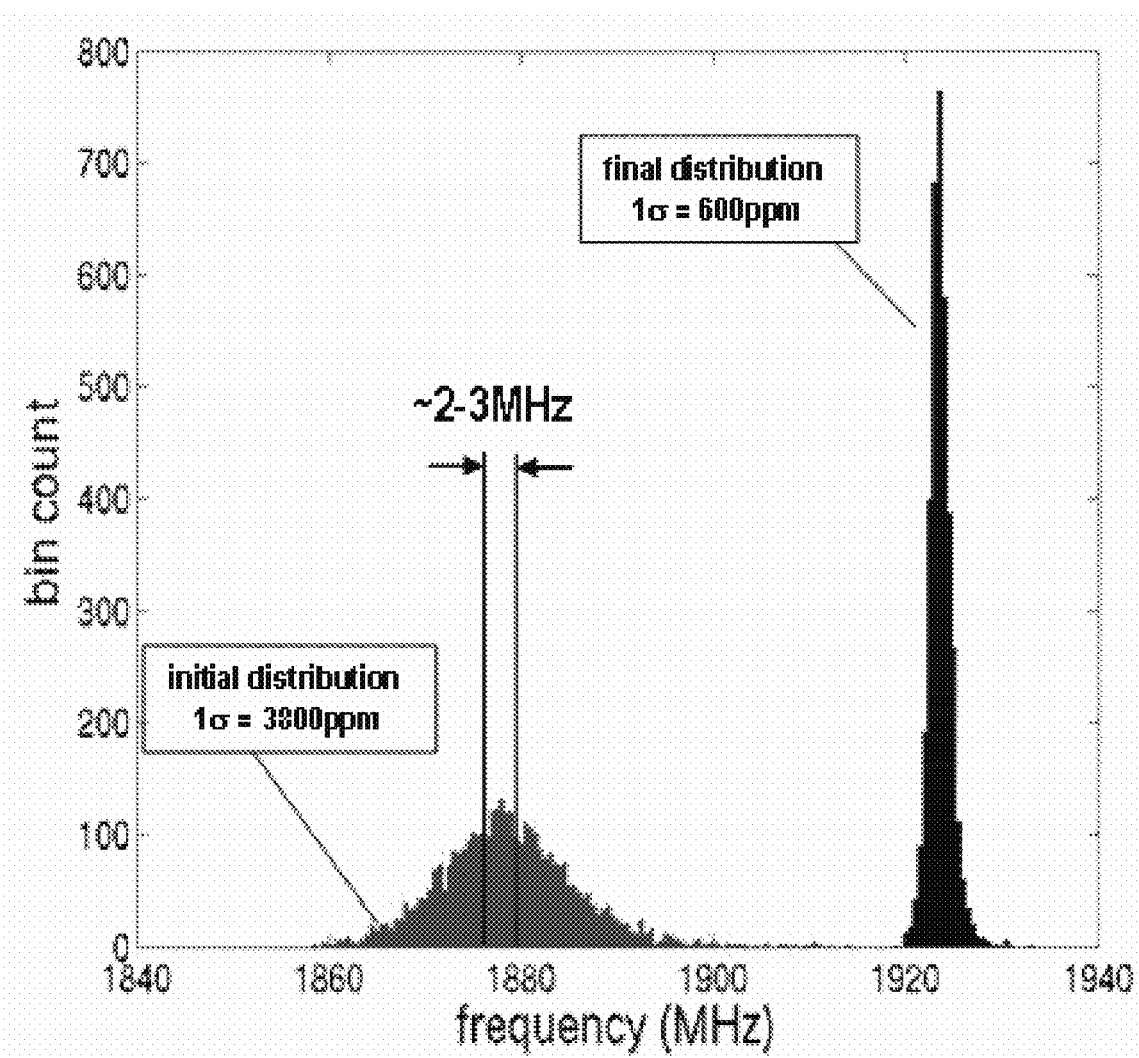
FIG. 4 shows the measured frequency distribution of center frequencies of a multitude of filter circuits before and after the trimming process.

FIG. 4 shows the frequency distribution of a multitude of measured filters produced on a wafer in a histogram. The left hand distribution shows the measured frequencies on the wafer after deposition of a trimming layer of silicon oxide. This distribution is called the initial distribution. The right hand distribution shows the measured frequencies on the same wafer after the trimming process according to the inventive method. The right hand distribution is called the final distribution.

After the deposition of a trimming layer, the mean frequency measured on the wafer is intentionally too low for the desired product. During the trimming process the frequencies are respectively shifted towards the goal frequency. As this process is controlled in the area according to the measured initial distribution and the initial deviation from the goal frequency calculated therefrom, the final distribution resulting from the process is much smaller. The measured final frequencies are within a smaller range.

In this embodiment, the standard deviation $1\sigma$ is about 3800 ppm for the initial distribution. By the trimming process, the standard deviation $1\sigma$ has been reduced to about 600 ppm. This makes the frequencies of at least 90% of the filters lie within an allowed tolerance. Thus, these 90% of the filters are correctly working filters.

Another embodiment or another allowed tolerance may still improve this yield.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a filter circuit comprising series and parallel coupled BAW resonators, the method comprising:
   depositing functional layers of a plurality of BAW resonators onto a substrate wafer, the functional layers comprising a bottom electrode, a piezoelectric layer, and a top electrode;
   structuring each of the functional layers to receive a plurality of circuits of BAW resonators, each circuit comprising series BAW resonators electrically coupled in series and parallel BAW resonators electrically coupled in parallel, wherein the coupling is done by the electrode layers;
   depositing a tuning layer of a first dielectric selectively onto the parallel BAW resonators on the wafer;
   measuring a resonance frequency of at least one type of the BAW resonators on the wafer;
   calculating a deviation of the measured resonance frequencies from a desired value;
   depositing a trimming layer onto the entire wafer; and
   selectively removing a thickness portion of the trimming layer, the portion being dependent on a location on the wafer and on the calculated deviation at this location.

2. The method of claim 1, wherein depositing the trimming layer onto the entire wafer comprises depositing a mask layer that covers a first type of BAW resonator and that uncovers a second type of BAW resonator.

3. The method of claim 1, wherein measuring the resonance frequency of at least one type of the BAW resonators comprises measuring the resonance frequencies of both series BAW resonators and parallel BAW resonators.

4. The method of claim 1, wherein measuring the resonance frequency of at least one type of the BAW resonators comprises measuring a respective resonance frequency of BAW resonators manufactured on a plurality of wafers that are processed at the same time.

5. The method of claim 1, wherein measuring the resonance frequency of at least one type of the BAW resonators comprises measuring selected filter circuits that are distributed over the wafer; and
   calculating the deviation of the measured resonance frequencies from a desired value comprises performing an interpolation step to determine a distribution of the deviation over the entire wafer and all filter circuits.

6. The method of claim 1, wherein depositing the trimming layer comprises depositing a layer of an oxide or a nitride.

7. The method of claim 1, wherein,
   a desired thickness of BAW resonators depends on a desired resonance frequency of the BAW resonators;
   the functional layers are deposited in a total thickness less than the desired thickness,
   removing a thickness portion of the trimming layer is performed to an extent that another thickness portion of the trimming layer remains on top of the BAW resonators, the other thickness portion functioning as a passivation layer of the filter circuit.

8. The method of claim 1, wherein the trimming layer is deposited in a thickness $d0$ where $d0 \geq 2dR$ and $dR$ is a calculated remaining thickness portion of the trimming layer.

9. The method of claim 1, wherein a desired thickness of the BAW resonators is calculated to be a sum of a total thickness of the functional layers plus at least 20 nm of the remaining trimming layer.

10. The method of claim 1, wherein the trimming layer is deposited in a thickness of at least 90 nm, and after removing the thickness portion of the trimming layer, a remaining thickness of the trimming layer of at least 10 nm remains.

11. The method of claim 1, wherein selectively removing a thickness portion of the trimming layer comprises removing the thickness portion of the trimming layer by a laser ablation process.

12. The method of claim 11, wherein the laser ablation process comprises scanning a laser over the trimming layer, thereby ablating the thickness portion according to energy impacted into the trimming layer by the laser and according to the amount of thickness that has to be removed.

13. The method of claim 1, wherein selectively removing a thickness portion of the trimming layer comprises removing the thickness portion of the trimming layer by an ion beam accelerated toward the substrate.

14. The method of claim 13, wherein the thickness portion of the trimming layer is removed by a reactive ion etch.

* * * * *